US012581986B2

(12) United States Patent
Monteiro Diniz Reis et al.

(10) Patent No.: US 12,581,986 B2
(45) Date of Patent: Mar. 17, 2026

(54) METHOD AND DEVICE FOR PRODUCING A SEMICONDUCTOR COMPONENT

(71) Applicant: Robert Bosch GmbH, Stuttgart (DE)

(72) Inventors: Daniel Monteiro Diniz Reis, Esslingen am Neckar (DE); Frank Schatz, Kornwestheim (DE); Mathias Mews, Reutlingen (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 406 days.

(21) Appl. No.: 18/249,351

(22) PCT Filed: Dec. 13, 2021

(86) PCT No.: PCT/EP2021/085397
§ 371 (c)(1),
(2) Date: Apr. 17, 2023

(87) PCT Pub. No.: WO2022/144163
PCT Pub. Date: Jul. 7, 2022

(65) Prior Publication Data
US 2023/0402412 A1 Dec. 14, 2023

(30) Foreign Application Priority Data

Jan. 4, 2021 (DE) .................... 10 2021 200 001.0

(51) Int. Cl.
*H01L 21/768* (2006.01)
*H01L 23/00* (2006.01)

(52) U.S. Cl.
CPC ........ *H01L 24/05* (2013.01); *H01L 21/76898* (2013.01); *H01L 24/03* (2013.01);
(Continued)

(58) Field of Classification Search
CPC ... H01L 21/66; H01L 21/02; H01L 21/76898; H01L 24/05
See application file for complete search history.

(56) References Cited

U.S. PATENT DOCUMENTS

| | | | | |
|---|---|---|---|---|
| 6,171,934 | B1 | 1/2001 | Joshi et al. | |
| 12,270,885 | B2 * | 4/2025 | Wang ................. | G01R 33/5617 |
| 2004/0169992 | A1 * | 9/2004 | Hunt ........................ | H01G 7/06 361/311 |
| 2010/0212129 | A1 | 8/2010 | Hara | |

(Continued)

FOREIGN PATENT DOCUMENTS

| | | |
|---|---|---|
| JP | H06342946 A | 12/1994 |
| JP | 2004227854 A | 8/2004 |

(Continued)

OTHER PUBLICATIONS

Reis et al. "Leakage Current in Low-Temperature PVD PZT Films," 2019 IEEE International Symposium on Applications of Ferroelectrics (2019); pp. 1-4.

(Continued)

*Primary Examiner* — Dale E Page
*Assistant Examiner* — Wilner Jean Baptiste
(74) *Attorney, Agent, or Firm* — NORTON ROSE FULBRIGHT US LLP

(57) ABSTRACT

A device and method for producing a semiconductor component. The method includes: arranging a dielectric layer between a first electrode and a second electrode of the semiconductor component, there being defects of a first defect type in the dielectric layer; determining a time period for movement of defects of the first defect type into a target position in the dielectric layer; determining a first voltage for the movement of said defects in the dielectric layer; applying the first voltage between the first electrode and the second electrode in the time period.

11 Claims, 7 Drawing Sheets

(52) U.S. Cl.
   CPC .............. *H01L 2224/04042* (2013.01); *H01L*
                                   *2924/1461* (2013.01)

(56)                  References Cited

U.S. PATENT DOCUMENTS

| | | | |
|---|---|---|---|
| 2013/0049207 A1* | 2/2013 | Liniger | H01L 21/76829 |
| | | | 257/E21.328 |
| 2014/0124725 A1 | 5/2014 | Chi et al. | |
| 2014/0273300 A1* | 9/2014 | Pramanik | H10D 1/692 |
| | | | 438/382 |
| 2020/0302028 A1 | 9/2020 | Natarajan et al. | |

FOREIGN PATENT DOCUMENTS

| | | |
|---|---|---|
| JP | 2007227854 A | 9/2007 |
| JP | 2016144289 A | 8/2016 |

OTHER PUBLICATIONS

Shiono et al. "Kinetics of Changes in Nf and Dit, at the Si-Sio2 Interface under Long-Term Positive as well as Negative Bias-Temperature Aging" Journal of the Electrochemical Society vol. 130, No. 1 (1983); pp. 138-143.
Brozek et al. "Polarity Dependence of Cumulative Properties of Charge-to-Breakdown in Very Thin Gate Oxides" Solid State Electronics vol. 41, No. 7. (1997);pp. 995-999.
Wang et al. "Humidity and polarity influence on MIM PZT capacitor degradation and breakdown," 2016 IEEE International Integrated Reliability Workshop (2016); pp. 1-4.
International Search Report for PCT/EP2021/085397, Apr. 12, 2022.

* cited by examiner

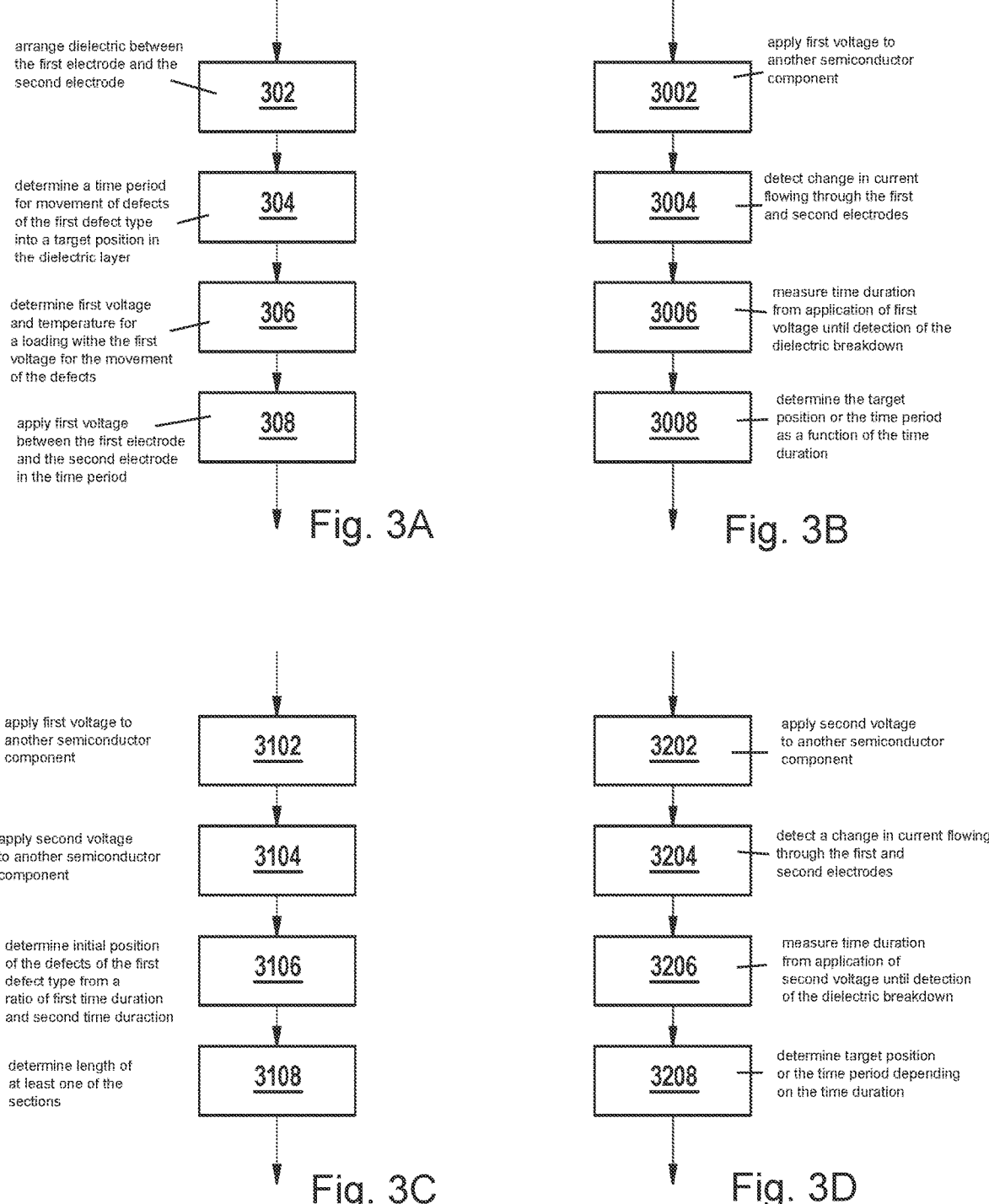

arrange dielectric between the first electrode and the second electrode

302 determine a time period for movement of defects of the first defect type into a target position in the dielectric layer

304 determine first voltage and temperature for a loading withe the first voltage for the movement of the defects

306 apply first voltage between the first electrode and the second electrode in the time period

308

Fig. 3A apply first voltage to another semiconductor component

3002 detect change in current flowing through the first and second electrodes

3004 measure time duration from application of first voltage until detection of the dielectric breakdown

3006 determine the target position or the time period as a function of the time duration

3008

Fig. 3B apply first voltage to another semiconductor component

3102 apply second voltage to another semiconductor component

3104 determine initial position of the defects of the first defect type from a ratio of first time duration and second time duraction

3106 determine length of at least one of the sections

3108

Fig. 3C apply second voltage to another semiconductor component

3202 detect a change in current flowing through the first and second electrodes

3204 measure time duration from application of second voltage until detection of the dielectric breakdown

3206 determine target position or the time period depending on the time duration

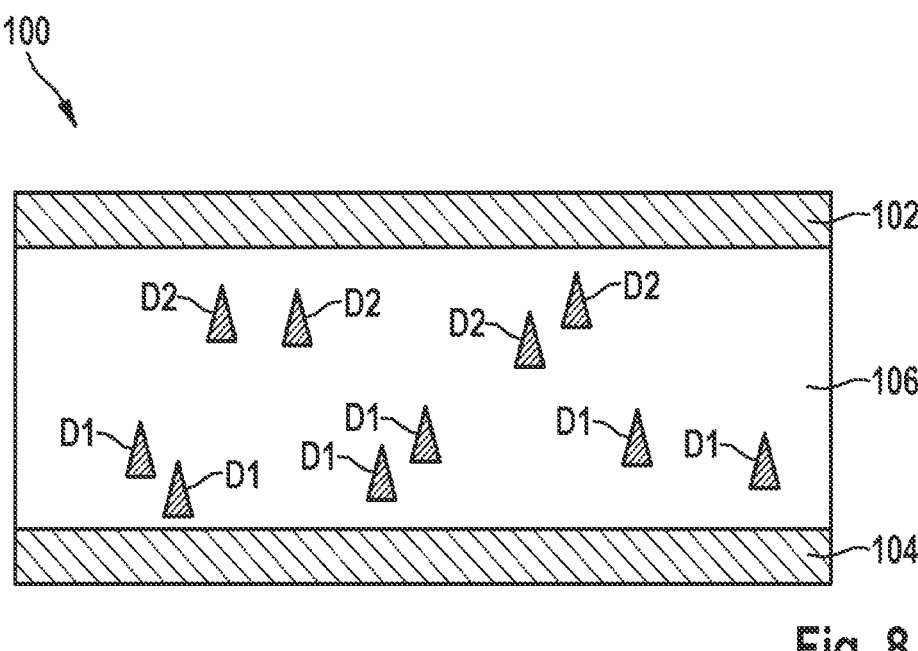

Fig. 8

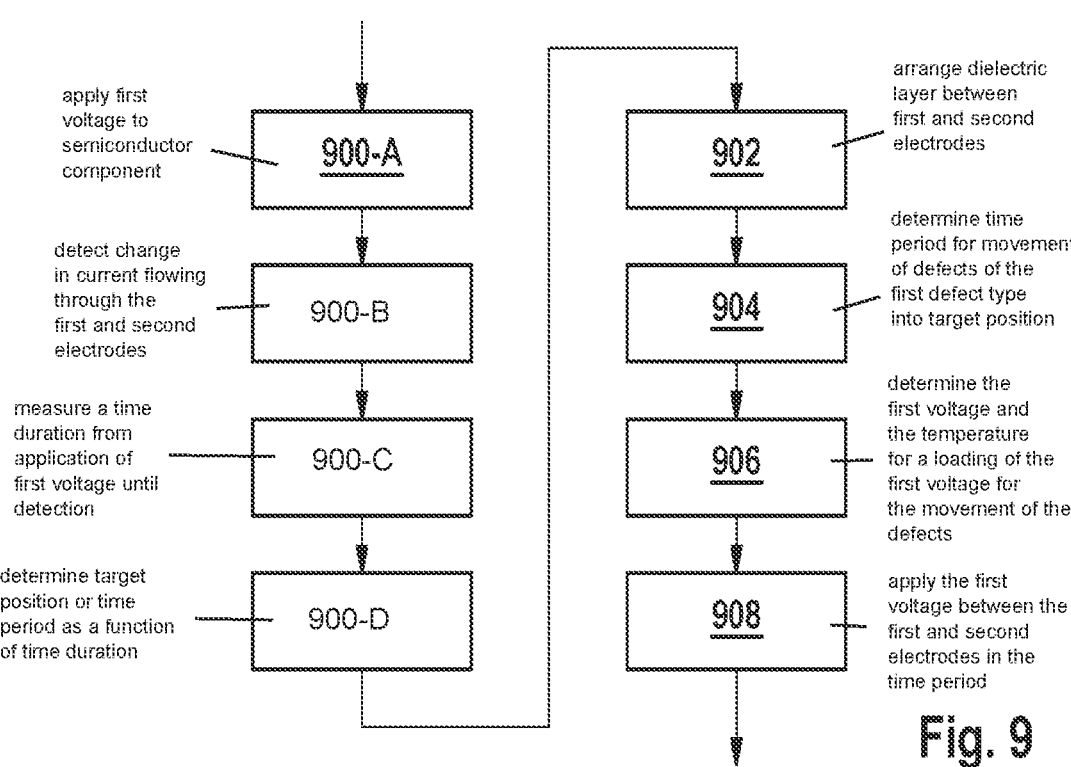

apply first voltage to semiconductor component — 900-A detect change in current flowing through the first and second electrodes — 900-B measure a time duration from application of first voltage until detection — 900-C determine target position or time period as a function of time duration — 900-D 902 — arrange dielectric layer between first and second electrodes 904 — determine time period for movement of defects of the first defect type into target position 906 — determine the first voltage and the temperature for a loading of the first voltage for the movement of the defects 908 — apply the first voltage between the first and second electrodes in the time period

Fig. 9

METHOD AND DEVICE FOR PRODUCING A SEMICONDUCTOR COMPONENT

FIELD

The present invention relates to a method and a device for producing the semiconductor component.

BACKGROUND INFORMATION

Such a semiconductor component may contain a dielectric layer with defects. During the intended operation of the semiconductor component, the defects in the dielectric layer can migrate between electrodes of the semiconductor component. The defects may attach to one of the electrodes. As a result, a dielectric breakdown may occur at this electrode, which dielectric breakdown shortens the service life of the semiconductor component.

After a dielectric breakdown, a function of the semiconductor component can be restored under certain conditions. This is described, for example, in J. Wang, C. Salm, E. Houwman, M. Nguyen and J. Schmitz, "Humidity and polarity influence on MIM PZT capacitor degradation and breakdown," 2016 IEEE International Integrated Reliability Workshop (IIRW), South Lake Tahoe, CA, 2016, pp. 65-68, doi: 10.1109/IIRW.2016.7904903.

SUMMARY

A method and a device according to the present invention may allow for movement of defects for the production of a semiconductor component with an extended lifetime.

By selectively influencing a physical degradation mechanism occurring as a result of movement of defects in dielectric layers, the lifetime is extended by an electrical pre-treatment.

This is made possible by a selective electrical preloading before delivery to a customer. The selective electrical preloading manipulates an initial position of the defects and/or a defect distribution in a dielectric layer of the semiconductor component. As a result, it is possible to adjust the lifetime of the semiconductor component.

In one aspect of the present invention, attachment of defects to a degrading interface relevant to the intended operation of the semiconductor component is delayed.

According to an example embodiment of the present invention, a method for producing the semiconductor component comprises the steps of arranging a dielectric layer between a first electrode and a second electrode of the semiconductor component, wherein defects of a first defect type are present in the dielectric layer; determining a time period for movement of defects of the first defect type into a target position in the dielectric layer; determining a first voltage for the movement of said defects in the dielectric layer; determining a temperature for a loading with the first voltage; applying the first voltage between the first electrode and the second electrode at the temperature in the time period.

Preferably, according to an example embodiment of the present invention, the first voltage or the time period is determined as a function of a property of the dielectric layer that characterizes an initial position for defects of the first defect type, and a property that characterizes a speed of movement of defects of the first defect type in the dielectric layer, wherein the first voltage or the time period is determined as a function of a distance between the initial position and the target position.

Preferably determined is the temperature that also determines a speed of movement of defects of the first defect type in the dielectric layer, wherein the first voltage is determined as a function of the speed in such a way that when the first voltage is applied for the time period, the defects of the first defect type reach the target position in the time period or at the end of the time period, and/or wherein the time period is determined as a function of the speed in such a way that when the first voltage is applied for the time period, the defects of the first defect type reach the target position in the time period or at the end of the time period.

According to an example embodiment of the present invention, it may be provided that when the first voltage with a first polarity is applied between the first electrode and the second electrode, the defects of the first defect type can be moved in a first direction toward the first electrode, wherein when a second voltage with a second polarity opposite to the first polarity is applied between the first electrode and the second electrode, the defects of the first defect type can be moved in a second direction toward the second electrode, wherein the method comprises the following steps: applying the second voltage; detecting a change in a current flowing through the first and second electrodes, and/or a change in a surface condition of the first electrode and/or a condition of a boundary layer between the first electrode and the dielectric layer; measuring a time duration from application of the first voltage until detection; determining the target position or the time period as a function of the time duration.

In one aspect of the present invention, defects are prepared that compensate for other defects that would otherwise degrade the interface during the intended operation.

Preferably, according to an example embodiment of the present invention, a property of the dielectric layer that characterizes an initial position for defects of the second defect type is determined, wherein the first voltage or the time period is determined as a function of a distance of the initial position for defects of the second defect type to the second electrode. A position of the defects of the second defect type in the dielectric layer can thereby be adjusted.

Preferably determined is a temperature that also determines a speed of movement of defects of the second defect type in the dielectric layer, wherein the first voltage is determined as a function of the speed of movement of defects of the second defect type in such a way that when the first voltage is applied at this temperature for the time period, the defects of the second defect type reach the second electrode in the time period or at the end of the time period, and/or wherein the time period is determined as a function of the speed of movement of defects of the second defect type in such a way that when the first voltage is applied at this temperature for the time period, the defects of the second defect type reach the second electrode in the time period or at the end of the time period.

In one aspect of the present invention, defects of a second defect type are present in the dielectric layer, wherein the method also comprises the steps of determining a second voltage with a polarity opposite to the first voltage, for loading the dielectric layer; determining a time period and a temperature for the loading; applying the second voltage between the first electrode and the second electrode at the temperature in the time period. If the defects of the first defect type move at a different speed than the defects of the second defect type, the second defects become displaceable relative to the first defects. As a result, a desired distribution of the defects in the dielectric layer can be adjusted. Under a loading with the first voltage, the defects of the second defect type may move in the same direction as the defects of the first defect type. The defects of the second defect type may also move in a direction opposite to a direction in which the defects of the first defect type move under the loading of the first voltage.

According to an example embodiment of the present invention, the method may provide for arranging the semiconductor component in an actuator, in particular a MEMS, a micromirror, a print head or a speaker.

According to an example embodiment of the present invention, the device for producing the semiconductor component or the actuator comprises a regulating and/or control unit designed to perform steps in the method.

According to an example embodiment of the present invention, the device preferably comprises a contacting unit for a wafer, wherein the wafer comprises a first electrode, a second electrode and a dielectric layer arranged between the first electrode and the second electrode, wherein the contacting unit is designed to apply a voltage between the first electrode and the second electrode of the wafer according to a specification of the regulating and/or control unit.

Further advantageous embodiments of the present invention arise from the following description and the figures.

BRIEF DESCRIPTION OF THE DRAWINGS

FIGS. 3A-3D show steps in a method for producing the first embodiment, according to the present invention.

FIG. 8 shows a schematic representation of a second embodiment of the semiconductor component, according to the present invention.

FIG. 9 shows steps in a method for producing the second embodiment, according to the present invention.

DETAILED DESCRIPTION OF EXAMPLE EMBODIMENTS

Figure 1:
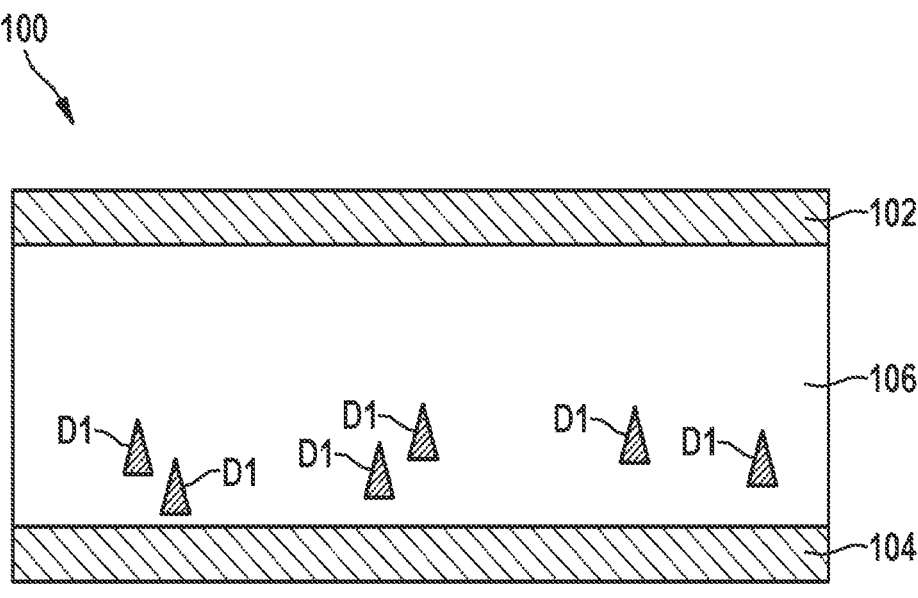
FIG. 1 shows a schematic representation of a first embodiment of a semiconductor component, according to the present invention.

FIG. 1 shows a schematic representation of a semiconductor component 100 according to a first embodiment. The semiconductor component 100 comprises a first electrode 102, a second electrode 104 and a dielectric layer 106.

The dielectric layer 106 is arranged between the first electrode 102 and the second electrode 104. In the example, the first electrode 102 and the second electrode 104 are arranged on opposite sides of the dielectric layer 106.

In the dielectric layer, defects D1 of a first defect type are present. These defects D1 are arranged in an initial position in the example. The initial position in the example is defined by a production process of the dielectric layer. The defects D1 are arranged in particular closer to the second electrode 104 than to the first electrode 102.

The defects D1 of the first defect type are charged defects that, when a potential is applied between the first electrode 102 and the second electrode 104, move according to their charge to a respective boundary layer between the dielectric layer 106 and either the first electrode 102 or the second electrode 104. The boundary layer is hereinafter referred to as interface. This transport of the charged defects is determined by defect properties and a hopping mechanism.

In this context, hopping mechanism means that a shift, i.e., a hopping, of the defects takes place in an electric field E acting in the dielectric layer 106 of thickness d as a result of the respectively applied voltage U. Defects of a defect type i move along localized defect states with a mean effective distance $a_i$. This results in a speed $v_i$ of movement of the defects of defect type i. The speed $v_i$ is described via the conventional approach of variable-range hopping:

$$v_i = C_{0,i}(a_i)e^{-\frac{E_{A,0,i}}{k_BT}}\sinh\left(\frac{N_{q,i}a_iE}{k_BT}\right)mit\ E = \frac{U}{d}$$

$$C_{0,i}(a_i) = v_0a_ie^{-\frac{2a_i}{\alpha}}$$

Here, $C_{0,i}(a_i)$ represents a function that represents an influence of a local defect distribution on a speed of the defects i $v_i$ characteristic in the dielectric layer 106. This defect distribution represents a property of the dielectric layer 106. This property determines the movement of the defects of defect type i in the dielectric layer 106. The parameters of decay length $\alpha$, mean effective distance $a_i$, activation energy $E_{A,0,i}$, electrical charge $N_{q,i}$ of the defects of defect type i are physical properties. $k_B$ denotes the Boltzmann constant. T denotes the temperature of the vicinity of the considered defect, in particular the temperature in the dielectric layer 106.

Until a dielectric failure, a temporal profile of a leakage current density $J_{TED}$ can be determined via the equation of the thermionic emission diffusion theory according to Crowell and Sze:

$$JTED = \frac{qN_Cv_R}{1+\frac{v_R}{v_D}}e^{-\frac{\Phi_B^{eff}}{k_BT}}\left[e^{\frac{qU}{k_BT}}-1\right]$$

Here, q represents the unit charge, $N_C$ the effective state density in the conduction band, $v_R$ the effective recombination speed, $v_D$ the effective diffusion speed, $\Phi_B^{eff}$ the effective Schottky barrier, kB the Boltzmann constant, T the temperature of the vicinity, and U the voltage across the dielectric layer 106.

Defects i with a positive charge migrate to the electrode with a negative potential and attach to the interface. Defects i with a negative charge move to the electrode with a positive potential and attach to the interface. This changes the effective Schottky barrier $\Phi_B^{eff}$.

A barrier height change $\Delta\Phi_i$ generated by defects i is characterized by its maximum height $\delta\Phi_i$ and a characteristic time constant $\tau_i$. The characteristic time constant $\tau_i$ defines a time duration in which the barrier height change $\Delta\Phi_i$ over the time t changes the most:

$$\Delta\Phi_i(t) = \delta\Phi_i\left(1 - e^{\frac{t}{\tau_i}}\right)$$

The maximum height $\delta\Phi_i$ is a function of a number $Z_i$ of defects i and depends on a type of interface. The term $$\left(1 - e^{\frac{t}{\tau_i}}\right)$$

describes the time-dependent attachment of a statistical distribution of the defects i in the material, in particular the time of attachment at the respective initial position. In the example, the initial position represents a center of the distribution. If there are several clusters for the defects of defect type i, one of the clusters may be selected that defines the initial position instead of the center. Preferably, the cluster that has the greatest influence on the increase in lifetime is selected.

Defects of various defect types may be present in the dielectric layer 106. Defects may exist that, due to their charge, cause a barrier height change $\Delta\Phi_i$ that increases the effective Schottky barrier $\Phi_B^{eff}$. This lowers the leakage current level. In this context, these defects are, by way of example, referred to as "restoring" defects. Defects may exist that, due to their charge, cause a barrier height change $\Delta\Phi_i$ that reduces the effective Schottky barrier $\Phi_B^{eff}$. This raises the leakage current level. In this context, these defects are, by way of example, referred to as "degrading" defects.

The following explains methods for manipulating a location of defect centers of "restoring" and "degrading" defects by means of selective electrical loading, if necessary under changing temperature and voltage.

As a result of differences in the activation energy $E_{A,0,i}$ and the electrical charge $N_{q,i}$, a transport speed of the involved defects relative to one another can change very significantly when the temperature and/or the voltage is varied, and the relative position of the defect distributions can be changed as a result. It is possible to selectively manipulate a starting position of the defect distributions within the dielectric layer 106 of layer thickness D.

When a voltage is applied, the defects are moved. The activation energy and charge may cause particular defects to be much faster. Selective manipulation of the distribution of the defects is possible by moving defects back and forth by varying the voltage, voltage polarity and temperature.

In the example, the starting position of defects i is defined by a distance $d_i$ of the center of their distribution to the interface toward which the defects i tend during the intended operation of the semiconductor component 100.

It is thus possible to:

a) change a defect structure, i.e., a temporal sequence of the attachment or the arrangement of the initial position of defects i.

b) remove a defect center of defects i associated with degradation from the interface tended toward during the intended operation of the semiconductor component 100, in order to optimize lifetime or leakage current level.

c) already attach a defect center of defects associated with restoration to an interface in order to optimize the leakage current level or achieve stabilization of the interface.

The selection of the voltage, the field strength and/or the temperature under which the selective loading is performed can be optimized for the respective defect structure. The process may be significantly accelerated under increased field strength and under increased temperature. However, under lower voltages, more defects can generally be attached because a voltage-dependent threshold value of the defect density at the interface for breakdown is higher than at higher voltages. The different speeds/accumulations under temperature and voltage of the present defect types may likewise be taken into account in order to obtain an optimum of time and effect.

An effective method to implement the production process is to carry out the loading at the wafer level. A layer stack that is deposited on the entire surface and that comprises, for example, at least two electrodes and a dielectric layer therebetween can thus be preloaded on the entire wafer instead of having to individually load the layer elements of each produced component.

The time constant $\tau_i$ may be different for the movement under the influence of the first voltage U1 than for the movement under the influence of the second voltage U2. The time constant $\tau_i$ may be defined by a mobility of the defects i under an influence of the electric field E in the dielectric layer 106 and by the path to be traveled in the dielectric layer 106 until the respective interface is reached. During the shift inside the dielectric layer 106, defect type i must travel the distance $d_i$ of the center of its distribution to the interface. Together with the speed $v_i$, the characteristic time constant $\tau_i$ for the attachment process of the defects i results in $$\tau_i = \frac{d_i}{v_i}$$

The time constant $\tau_i$ can be determined from a measurement of the leakage current over time and evaluation of the time-dependent profile by means of the equations of the thermionic emission diffusion theory according to Crowell and Sze and the time-dependent behavior of the barrier height change. By means of several measurements of $\tau_i$ under different temperatures T and voltages U, the activation energy $E_{A,0,i}$ and the electrical charge $N_{q,i}$ of the defects of defect type i can be determined.

When a first electrical voltage U1 with a first polarity is applied, charged defects D1 of the first defect type move in a first direction toward the first electrode 102. When a second electrical voltage U2 with a polarity opposite to the first electrical voltage U1 is applied, these charged defects D1 of the first defect type move in a second direction toward the second electrode 102.

Charged defects D1 of the first defect type that reach the interface at the first electrode 102 or the second electrode 104 attach to the interface.

The semiconductor component 100 according to the first embodiment may comprise more than two electrodes. The semiconductor component 100 may have more than one dielectric layer respectively located between two electrodes.

In such semiconductor components, a dielectric breakdown is possible if they are operated while applying an electrical voltage. If a dielectric breakdown occurs, the interface is partially or completely destroyed. If a dielectric breakdown occurs, a service life of the semiconductor component 100 is shortened. For example, the dielectric breakdown occurs if a number of charged defects attaching to the interface exceeds the voltage-dependent threshold value.

By optimizing process conditions and/or a process control in a production of the dielectric layer 106, physical properties and production-specific influences on these physical properties can be influenced. This can extend the service life.

For example, the process conditions and/or the process control influences growth, growth conditions, material composition. For example, the process conditions and/or the process control result in intentional or unintentional doping and/or contamination during the growth process or in subsequent processes.

The service life of the semiconductor component 100 is extended, as described below, by selectively changing the initial position of the defects D1 of the first defect type after the production of the dielectric layer 106 with the physical properties mentioned.

Figure 2:
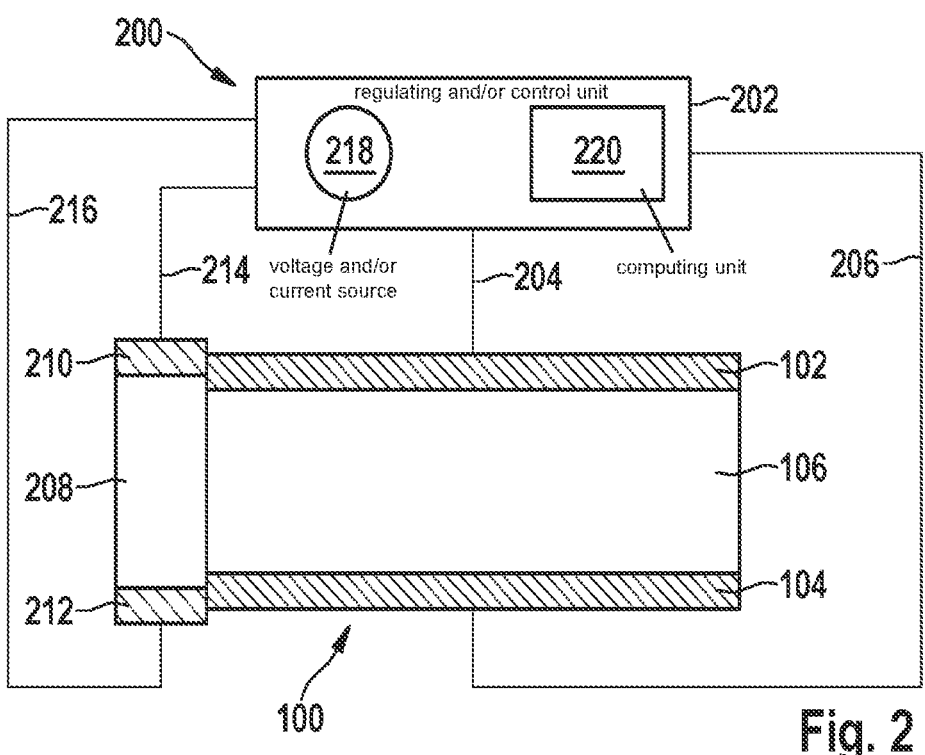
FIG. 2 shows a schematic representation of a device for producing the semiconductor component, according to an example embodiment of the present invention.

In FIG. 2, a device 200 for producing the semiconductor component 100 according to the first embodiment is shown schematically.

The device 200 comprises a regulating and/or control unit 202 designed to perform steps in a method, described below, for producing the semiconductor component 100 according to the first embodiment. The device 200 can be connected to at least intermittently to the first electrode 102 of the semiconductor component 100 via a first conductor 204. The device 200 can be connected at least intermittently to the second electrode 104 of the semiconductor component 100 via a second conductor 206.

In the example, the regulating and/or control unit 202 is designed to output a first voltage U1 with a first polarity. In the example, the first voltage U1 is applied between the first electrode 102 and the second electrode 104 when they are connected by means of the respective conductor to the device 200 and the regulating and/or control unit 202 outputs the first voltage U1.

In the example, the regulating and/or control unit 202 is designed to output a second voltage U2 with a polarity opposite to the first polarity. In the example, the second voltage U2 is applied between the first electrode 102 and the second electrode 104 when they are connected by means of the respective conductor to the device 200 and the regulating and/or control unit 202 outputs the second voltage U2.

The control unit may be designed to output a substantially constant value for the first voltage U1 and/or the second voltage U2. This value is, for example, in the range of 1 volt to 80 volts and is preferably 1 volt, 2 volts, or 5 volts, or 10 volts, or 20 volts, or 40 or 80 volts.

Preferably, the dielectric layer 106 is formed as polycrystalline high-k oxide dielectrics.

The dielectric layer 106 is in particular designed as a PZT layer. PZT here denotes $Pb(Zr_xTi_{1-x})O_3$.

The dielectric layer 106 is in particular designed as a KNN layer. KNN here denotes $(K_xNa_{1-x})NbO_3$.

The dielectric layer 106 can in particular be designed as a $HfO_2$, $HfZrO_2$, $ZrO_2$, $BaTiO_3$, $SrTiO_3$ or $(Ba_xSr_{1-x})TiO_3$ layer.

Preferably, the dielectric layer 106 is doped. For example, the dielectric layer 106 is a nickel-doped PZT layer:

$$Pb(Zr_xTi_{1-x})O_3Ni_y.$$

Both the PZT layer and the KNN layer may have dopings other than nickel, for example Nb, La, Mn, Mg.

Preferably, the dielectric layer is designed as a sputtered PZT layer. In this case, the so-called target material is deposited in a plasma on a substrate. PZT is, for example, used as the target material. Preferably, the sputtered PZT layer in this context has a deposition temperature of less than 500° C.

Preferably, the thickness of the dielectric layer is in the range of 500 nm to 4 µm. This is a useful range for actuators. Preferably, the layer thickness is 1 µm, or 4 µm. Larger layer thicknesses are likewise possible. The described procedure can be performed for all layer thicknesses.

Smaller layer thicknesses are likewise possible. Preferably, the thickness of the dielectric layer in the range of less than 500 nm is, for example, for applications apart from the actuators. An example in this respect is an application of high-k dielectrics, e.g., as a memory. The memory may be a resistive random access memory, ReRAM, or a ferroelectric random access memory, FeRAM. Depending on the application, thicknesses of 15 nm to 200 nm are useful for these other applications.

In addition, very thin high-k dielectrics with layers can, for example, be used as gate oxides in a multiplicity of applications. For example, HfO2 or SiO2 of a layer thickness of less than or equal to 50 nm may be provided as the dielectric layer 106.

The regulating unit can be designed to regulate a target value for the first voltage U1. This target value is, for example, in the range of 1 volt to 80 volts and is preferably 1 volt, 2 volts, or 5 volts, or 10 volts, or 20 volts, or 40 or 80 volts.

The regulating unit can be designed to regulate a target value for the second voltage U2. This target value is, for example, in the range of 1 volt to 80 volts and is preferably 1 volt, 2 volts, or 5 volts, or 10 volts, or 20 volts, or 40 or 80 volts.

In this case, a voltage measuring device designed to sense the voltage between the first electrode 102 and the second electrode 104 may be provided. The regulating unit is in this case designed to reduce a control deviation, which is determined as a function of a difference between this sensed voltage and the target value.

For example, a wafer is produced in which the dielectric layer 106 is arranged between the first electrode 102 and the second electrode 104.

The device 200 in the example optionally comprises a heating unit 208. The heating unit 208 in the example is designed to heat the dielectric layer 106.

The heating unit 208 may be a furnace, wherein the wafer temperature is controlled in the furnace.

The heating unit 208 may be designed as a heating coil. In the example, the heating unit 208 is arranged on the dielectric layer 106. In the example, the heating unit 208 is arranged so as to be electrically and/or electromagnetically insulated from the dielectric layer 106. A corresponding arrangement on a side, facing away from dielectric layer 106, of one of the electrodes is also possible. The heating unit 208 may be detachably arranged on the first electrode 102. The heating unit 208 may be detachably arranged on the second electrode 104. The heating unit 208 may be detachably arranged on the dielectric layer 106.

The heating unit 208 may also be externally arranged on a housing around the semiconductor component 100. In the housing, the dielectric layer 106 and the first electrode 102 and the second electrode 104 may be arranged. The heating unit 208 may be detachably arranged on the housing.

In the example, the heating unit 208 can be electrically heated via a first contact 210 and a second contact 212.

The regulating and/or control unit 202 in the example can be connected at least intermittently to the first contact 210 via a third conductor 214 and to the second contact 212 via a fourth conductor 216. The regulating and/or control unit 202 in the example is designed to output a current I1 to bring about the current I1 through the heating means 208.

The device 200 in this example optionally comprises a voltage and/or current source 218. The device 200 in the example comprises a computing unit 220, in particular a microprocessor, which is designed to perform the methods described below.

The control unit may be designed to output a substantially constant value for the current I1. This value is, for example, in a range where the heating unit 208 heats the dielectric layer to a temperature of between 100° Celsius and 200° Celsius.

The regulating unit can be designed to regulate a target value for the current I1. This target value is, for example, in a range where the heating unit 208 heats the dielectric layer to a temperature of between 100° Celsius and 200° Celsius. In this case, a temperature measuring device designed to sense the temperature of the dielectric layer 106 may be provided. The regulating unit is in this case designed to reduce a control deviation, which is determined as a function of a difference between this sensed temperature and the target value. The temperature may also be sensed elsewhere, e.g., on the housing, the heating unit 208, or in a vicinity of the dielectric layer 106.

A method for producing the semiconductor component 100 according to the first embodiment is described below with reference to FIG. 3A.

By selective electrical loading, the method adjusts the location of the defect center as a step in the production process. Defects associated with degradation of the interface may be further removed from the interface tended toward under operating conditions, i.e., the interface to which these defects attach due to their charge depending on the polarity used during the intended operation of the semiconductor component 100. This increases the lifetime. The maximum distance to the interface tended toward during operation is the complete attachment of substantially all defects to the opposite interface.

The method in the example provides the following steps.

Step 302: arranging the dielectric layer 106 between the first electrode 102 and the second electrode 104.

Defects D1 of the first defect type are present in the dielectric layer 106.

Figure 4:
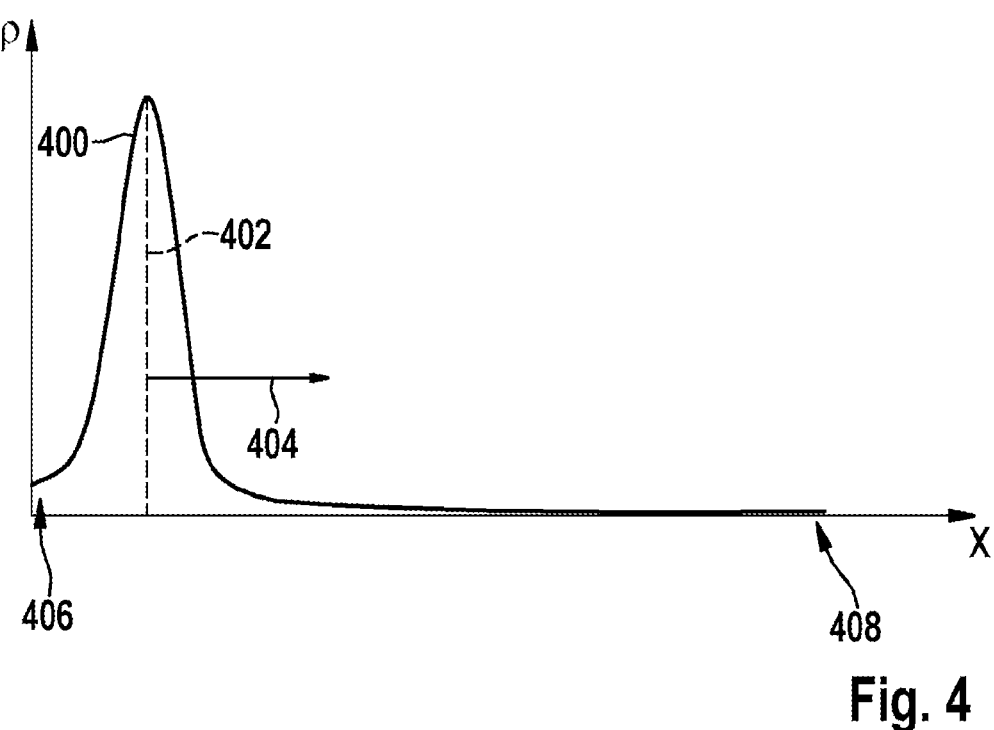
FIG. 4 shows a density of distribution of defects in an initial position.

FIG. 4 schematically shows a density p of a distribution 400 of the defects D1 of the first defect type over a profile x of the dielectric layer 106 in the initial position 402, i.e., the center of the distribution 400 at the start of applying the first voltage U1. The density $\rho$ of the defects D1 of the first defect type is greatest in the initial position 402 and drops sharply with increasing distance from the initial position 402. At a location 408 of the first electrode 102 and a location 406 of the second electrode 104, the density $\rho$ in the example tends toward zero. While the first voltage U1 is applied, the defects D1 of the first defect type move in the direction 404 away from the location 406 of the second electrode 104 toward the location 408 of the first electrode 102.

Step 304: determining a time period for movement of defects D1 of the first defect type into a target position in the dielectric layer.

The time period may be selected to be shorter with increasing first voltage U1 at constant temperature or with increasing temperature. The time period may be selected to be shorter with increasing temperature at constant first voltage U1 or with increasing first voltage U1. The time period may be specified in a range of 1 minute to 60 minutes, one hour to 24 hours, or more than one day. The time period may, for example, be three hours, one day, two days, or three days.

The time period may be determined starting from the initial position 402 of the defects D1 of the first defect type for a maximum possible service life. Due to time constraints in a production process in which the method is used, or due to a lower requirement for the service life of the semiconductor component 100, or due to concerns with respect to a stability of the interface at the first electrode 102 after displacement of the defects D1 of the first defect type to there, the time period can be selected to be shorter than the time period for reaching the maximum service life.

It may be provided to specify the temperature according to the conditions of the intended operation. It may be provided to specify the temperature for operation at an elevated temperature or reduced temperatures.

It may be provided to determine the initial positions, the speeds under these conditions, as well as the activation energies and the charges of the defects in experiments. For example, while varying the first voltage U1 used and the temperature, experiments are performed until suitable conditions are found.

For example, during the intended operation of the semiconductor component 100, a first time to first dielectric breakdown is determined without prior application of the first voltage U1. The first time indicates a time duration during which enough defects D1 of the first defect type move from the initial position to the attachment to the degenerating interface that dielectric breakdown occurs. For example, in experiments, different first voltages U1 are applied to different semiconductor components 100 at different temperatures for different time durations. For example, a second time until first dielectric breakdown during the intended operation is determined for each of these semiconductor components 100 treated in this way. For example, the first voltage U1, the temperature and the time duration from the experiment for which the second time is three times as large as the first time are specified for the production process.

If the time duration found in this way is too high for economic implementation, it may be provided to find conditions under which the time duration is lower in comparison, in particular without shortening the second time. For example, it may be provided to increase the temperature. For example, it may be provided to increase the first voltage U1.

It may be provided to look for a first voltage U1 that results in a particularly large ratio of the time duration to the second time.

Preferably, the experiments are started at a first voltage U1, for example 1V, and a temperature, for example 200° C., and the first voltage U1 and/or the temperature is increased in subsequent experiments.

It may be provided that a target defect structure is selected in which a distance of the initial positions of all defects D1 of the first defect type or a selected starting point for the defects D1 of the first defect type to the interface degrading during the intended operation is maximal. This can be done under the framework condition that a proportion of attached defects D1 of the first defect type on the opposite interface is less than a critical threshold. It may be provided that a loading time that can in particular be performed economically is specified as a time period for the application of the first voltage U1. It may be provided to look in experiments for a combination of temperature and first voltage U1 at which a number of defects D1 of the first defect type that attach to the opposite interface when the voltage U1 is applied at the temperature for the time duration is less than the critical threshold.

For several different degrading defect types, a sum, which is in particular weighted, that defines the number can be determined. For example, in addition to the defects D1 of the first defect type, further other defects moving under the first voltage U1 in the same direction as the defects D1 of the first defect type are contained in the semiconductor component

100. Taking into account the number of these effects in the sum, which is in particular weighted, avoids that too many of these defects attach to the interface in the time duration for the first voltage U1.

The time period may be determined as described below by experiments with a portion of the wafer from which the semiconductor component 100 is manufactured.

Step 306: determining the first voltage U1 and the temperature for a loading with the first voltage U1 for the movement of these defects in the dielectric layer 106.

Steps 302, 304, 306 may be performed in this or another order.

Step 308: applying the first voltage between the first electrode 102 and the second electrode 104 in the time period.

As a result, the defects D1 of the first defect type move in the direction 404.

Figure 5:
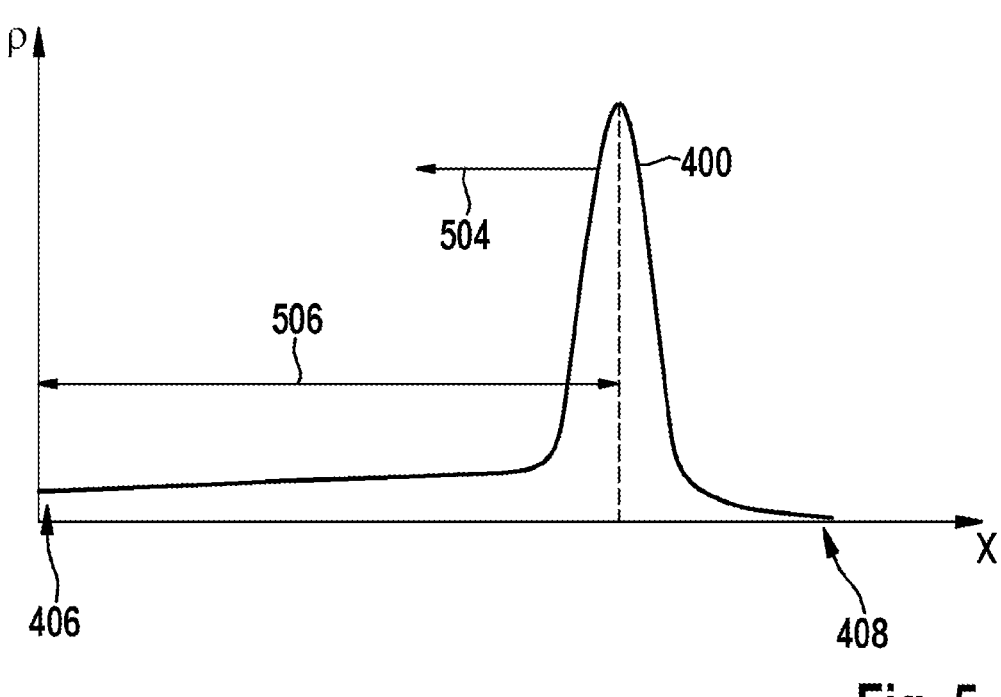
FIG. 5 shows a density of distribution of defects in an end position.

FIG. 5 schematically shows the density ρ of the distribution 400 of the defects D1 of the first defect type over the profile x of the dielectric layer 106 in an end position, i.e., at the end of the time period. The density ρ of the defects D1 of the first defect type is greatest in a position 502, i.e., the center of the distribution 400, and drops sharply with increasing distance from the position 502. At the location 406 of the first electrode 102 and at the location 406 of the second electrode 104, the density ρ in the example tends toward zero.

While the second voltage U2 is applied during the intended use, the defects D1 of the first defect type can move in the direction 504 away from the location 408 of the first electrode 102 toward the location 406 of the second electrode 104. Until the location 406 of the second electrode 104 is reached, most of the defects D1 of the first defect type must travel a distance 506 between the position 502 and the location 406 of the second electrode 104.

The first voltage U1 or the time period may be determined as a function of a property of the dielectric layer 106 that characterizes the initial position for defects D1 of the first defect type, and a property that characterizes a speed of movement of defects of the first defect type in the dielectric layer.

The first voltage U1 or the time period may be determined as a function of a distance between the initial position and the target position.

In the example, the time period for the defects D1 of the first defect type is selected such that the time period is shorter than a time constant $t_1$ determined for these defects for the movement in the first direction toward the first electrode 102.

For determining this time constant $t_1$, the method may, for example, provide the following steps shown in FIG. 3B:

3002 Applying the first voltage U1, in particular to another semiconductor component produced using the same production process as the semiconductor component 100 or in the same batch as the latter. The first voltage U1 is preferably applied at a specified temperature.

3004 Detecting a change in a current flowing through the first and second electrodes of this other semiconductor component.

Figure 6:
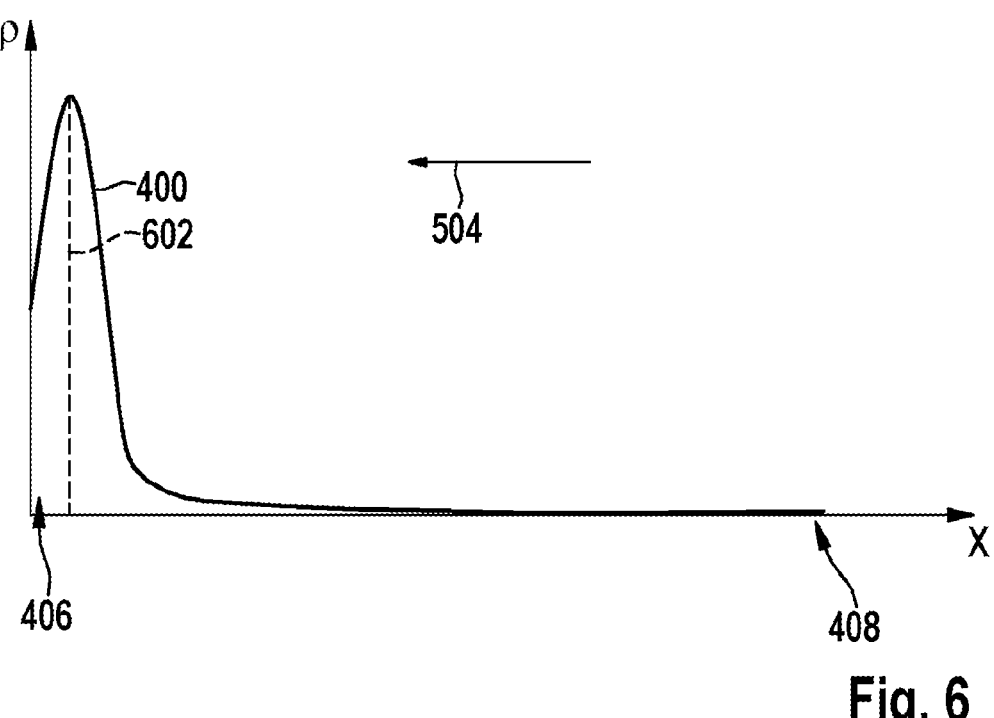
FIG. 6 shows a density of distribution during an intended operation.

FIG. 6 schematically shows the density ρ of the distribution 400 of the defects D1 of the first defect type over the profile x of the dielectric layer 106 for this case. The density ρ of the defects D1 of the first defect type is greatest in position 602 and drops sharply with increasing distance from the position 602. At the location 406 of the second electrode 104, the density ρ increases in the example. The defects D1 of the first defect type accumulated during the operation of the semiconductor component 100 at the second voltage U2 are attached there. The defects D1 of the first defect type attached in the interface cause a leakage current. At the location 408 of the first electrode 102, the density ρ in the example tends toward zero.

3006 Measuring a time duration from application of the first voltage U1 until detection of the dielectric breakdown. This time duration defines the time constant $t_1$.

3008 Determining the target position or the time period as a function of the time duration.

Steps 3002, 3004, 3006, and 3008 are optional. It may be provided that these steps are performed before step 302.

Instead of determining the time constant $t_1$ in this way, it can be provided, as shown in FIG. 3C, to determine the initial position of the defects D1 of the first defect type with the following steps.

3102 Applying the first voltage U1, in particular to another semiconductor component produced using the same production process as the semiconductor component 100 or in the same batch as the latter. determining a first time duration until the characteristic time $τ_1$ for the attachment of the defects of defect type 1 to the interface (102) can be derived from the current profile over time.

The first voltage U1 is preferably applied at a specified temperature.

3104 Applying the second voltage U2, in particular to another semiconductor component produced using the same production process as the semiconductor component 100 or in the same batch as the latter. determining a second time duration until the characteristic time $τ_2$ for the attachment of the defects of defect type 1 to the interface (104) can be derived from the current profile over time. In the example, the second voltage U2 is applied with the same voltage strength and a polarity opposite to the first voltage U1. As a result, an expected speed of the defects D1 of the first defect type in the dielectric layer 106 is the same.

3106 Determining the initial position of the defects D1 of the first defect type from a ratio of the first time duration to the second time duration. The ratio of the first time duration to the second time duration is proportional to a ratio of the two sections from the initial position to the first electrode 102 and from the initial position to the second electrode 104. In the example, starting from a known layer thickness of the dielectric layer, the initial position of the defects D1 of the first defect type is determined from the ratio.

3108 Determining the length of at least one of the sections. Determining the speed of the defects D1 of the first defect type as a function of the length and duration for this section. Determining the time constant $t_1$ as a function of the layer thickness and the speed.

As a further alternative, the following procedure, shown in FIG. 3D, may be provided.

3202 Applying the second voltage U2, in particular to another semiconductor component produced using the same production process as the semiconductor component 100 or in the same batch as the latter.

The first voltage U2 is preferably applied at a specified temperature.

3204 Detecting a change in a current flowing through the first and second electrodes of this other semiconductor component.

FIG. 6 schematically shows the density ρ of the distribution 400 of the defects D1 of the first defect type over the profile x of the dielectric layer 106 for this case. The density ρ of the defects D1 of the first defect type is greatest in the position 602 and drops sharply with increasing distance from the position 602. At the location 406 of the second electrode 104, the density ρ increases in the example. The defects D1 of the first defect type accumulated during the operation of the semiconductor component 100 at the second voltage U2 are attached there. The defects D1 of the first defect type attached in the interface cause a leakage current. At the location 408 of the first electrode 102, the density ρ in the example tends toward zero.

3206 Measuring a time duration from application of the second voltage U2 until detection of the dielectric breakdown. This time duration defines the time constant $t_2$.

3208 Determining the target position or the time period depending on the time duration.

Figure 7:
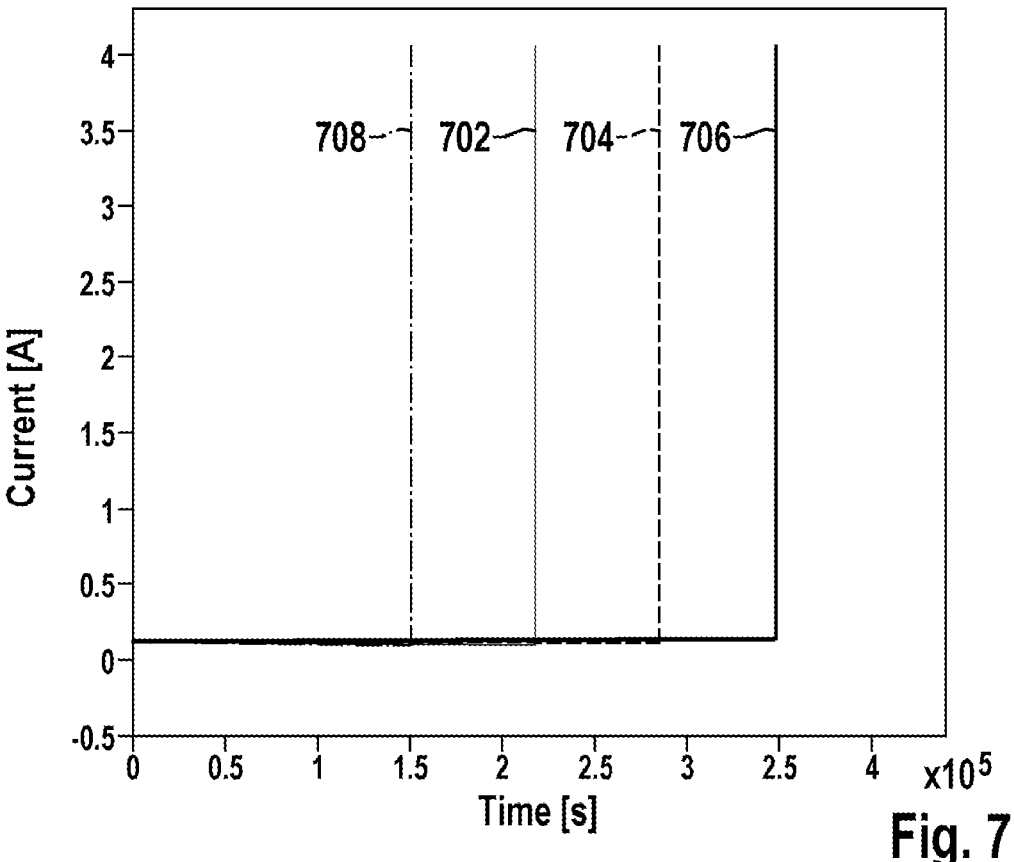
FIG. 7 shows a current profile.

FIG. 7 shows a first current profile 702 over the time t for this case. The portion of the wafer at which the first current profile 702 is measured has been operated for a day at the first voltage U1=+5. The first current profile 702 is shown for a temperature of 150° Celsius and a second voltage U2 that generates an electric field strength of E=50 kV/cm at a negative polarity of the first electrode 102. In this example, a dielectric breakdown occurs at $2.2*10^5$ seconds. The dielectric breakdown in the example occurs when a rapid increase in current to $1*10^{-6}$ amperes occurs.

FIG. 7 shows a second current profile 704 for operating another portion of the wafer that is operated at the same second voltage U2 and the same temperature. It arises if the portion of the wafer has been operated at the first voltage U1=+5 for two days with otherwise unchanged parameters. In this example, a dielectric breakdown occurs at $2.9*10^5$ seconds. The dielectric breakdown in the example occurs when a rapid increase in current to $1*10^{-6}$ amperes occurs.

FIG. 7 shows a third current profile 706 for operating another portion of the wafer that is operated at the same second voltage U2 and the same temperature. It arises if the portion of the wafer has been operated at the first voltage U1=+5 for three days with otherwise unchanged parameters. In this example, a dielectric breakdown occurs at $3.5*10^5$ seconds. The dielectric breakdown in the example occurs when a rapid increase in current to $1*10^{-6}$ amperes occurs.

FIG. 7 shows a current profile 708 for operating the wafer that is untreated after production and is operated at the same second voltage U2 and the same temperature. In this context, untreated means that the wafer was not operated at the first voltage U1. In this example, a dielectric breakdown occurs at $1.5*10^5$ seconds. The dielectric breakdown in the example occurs when a rapid increase in current to $1*10^{-6}$ amperes occurs. The time that elapses from application of the second voltage U2 until dielectric breakdown is a measure of the initial position of the defects D1 of the first defect type. With knowledge of the time, the temperature and the second voltage U2, the initial position can be determined as a function of the speed of the defects D1 of the first defect type in the dielectric layer 106. For a maximum service life of the semiconductor component 100, it may be provided to select the interface at the first electrode 102 as the target position. The time duration until the displacement of the defects D1 of the first defect type from this initial position to there is directly known for this temperature and second voltage U2. At a different second voltage U2 or a different temperature, the time duration can be determined by means of the speed as a function of a distance between the initial position and the interface at the first electrode 102. At the same voltage and the same temperature, any desired target position may be selected. Based on knowledge of the initial position, the time duration can be determined by means of the speed, from the difference between the initial position and the target position, i.e., the distance that the defects D1 of the first defect type must travel until the target position is reached.

It may subsequently be checked whether the time duration until the change in the current is detected is one day.

The time period may be selected to be shorter with increasing second voltage U2 at constant temperature or with increasing temperature. The time period may be selected to be shorter with increasing temperature at constant second voltage U2 or with increasing second voltage U2. The time period may be specified in a range of 1 minute to 60 minutes, one hour to 24 hours, or more than one day. This process can be performed for different time durations, e.g., of three hours or of two days or three days.

Instead of detecting the change in current, a change in a surface condition of the first electrode 102 and/or a condition of a boundary layer between the first electrode 102 and the dielectric layer 106 may be detected.

It may be provided that the temperature T characterizing a speed $v_1$ of movement of defects D1 of the first defect type in the dielectric layer 106 is determined.

It may be provided that the first voltage is determined in this case as a function of the speed $v_1$ in such a way that the defects D1 of the first defect type reach the target position in the time period or at the end of the time period when the first voltage is applied for the time period.

It may be provided that the time period is determined in this case as a function of the speed $v_1$ in such a way that the defects D1 of the first defect type reach the target position in the time period or at the end of the time period when the first voltage is applied for the time period.

The defects D1 of the first defect type are moved in the first direction into the target position when the first voltage U1 is applied for the time period determined for this purpose. During an intended operation of the semiconductor component 100, the defects D1 of the first defect type then move in the second direction from the target position toward the second electrode when the second voltage U2 is applied. The target position is defined by a specified goal to be achieved. For example, the goal is for the semiconductor component to have, in comparison to a service life without prior treatment, a greater service life that is greater than 2 days.

FIG. 8 shows a schematic representation of the semiconductor component 100 according to a second embodiment. With regard to the defects D1 of the first defect type, the semiconductor component 100 according to the second embodiment is designed like the semiconductor component 100 according to the first embodiment. In contrast to the first embodiment, defects D2 of a second defect type are additionally present in the dielectric layer in the second embodiment. Due to the production process of the dielectric layer 106, the defects D2 in the example are arranged at a different initial position than the defects D1. The defects D2 are arranged in particular closer to the second electrode 104 than to the first electrode 104.

With respect to applying the first voltage U1 and the second voltage U2 and with regard to the movement of the defects D1 of the first defect type in the dielectric layer 106, The semiconductor component 100 according to the second embodiment is designed like the semiconductor component 100 according to the first embodiment. The charged defects D2 of the second defect type can also be movable by the first electrical voltage U1 in the same direction as the defects D1 of the first defect type or in the opposite direction.

The semiconductor component 100 according to the second embodiment may comprise more than two electrodes.

The semiconductor component 100 may have more than one dielectric layer respectively located between two electrodes.

For example, the process conditions and/or the process control influences growth, growth conditions, material composition with regard to the defects D1 of the first defect type and/or defects D2 of the second defect type. For example, the process conditions and/or the process control result in intentional or unintentional doping and/or contamination during the growth process or in subsequent processes.

The service life of the semiconductor component 100 is extended, as described below, by selectively changing the initial position of the defects D1 of the first defect type and/or selectively changing the initial position of the defects D2 of the second defect type after the production of the dielectric layer 106 with the physical properties mentioned.

A method for producing the semiconductor component 100 according to the second embodiment is described below with reference to FIG. 9.

By this method, as a step in the production process, the location of the defect center of "restoring" defects D2 of the second defect type can be completely attached by selective electrical loading to the interface "degrading" during the intended operation of the semiconductor component 100. By this method, the location of the defect center of "restoring" defects D2 of the second defect type to this interface can be obtained by the below-described measures during the intended operation of the semiconductor component 100. In addition, the leakage current level can be lowered. This is likewise advantageous for many applications since it can improve a signal-to-noise ratio and/or reduce an energy loss through leakage current.

The method in the example comprises at least the following steps:

> 902: arranging the dielectric layer 106 between the first electrode 102 and the second electrode 104.

Defects D1 of the first defect type and defects D2 of the second defect type are present in the dielectric layer 106.

> 904: determining the time period for the movement of defects D1 of the first defect type into a target position in the dielectric layer 106.

The time period may be determined for a maximum possible service life. Due to time constraints in a production process in which the method is used, or due to a lower requirement for the service life of the semiconductor component 100, or due to concerns with respect to a stability of the interface at the first electrode 102 after displacement of the defects D1 of the first defect type to there, the time period can be selected to be shorter than the time period for reaching the maximum service life.

> 906: determining the first voltage U1 and the temperature for a loading with the first voltage U1 for the movement of these defects in the dielectric layer 106.

It may be provided to specify the first voltage U1 and the temperature according to the conditions of the intended operation. It may be provided that the first voltage U1 and the temperature be specified for operation at an elevated temperature or an elevated voltage or reduced temperatures or a reduced voltage.

The first voltage U1 or the time period may be determined as a function of a distance of an initial position for defects D2 of the second defect type to the second electrode 102.

It may be provided that the temperature T also determining a speed $v_2$ of movement of defects D2 of the second defect type in the dielectric layer 106 is determined, in particular in the vicinity of the defects D2 of the second defect type.

The first voltage U1 may be determined as a function of the speed $v_2$ of movement of defects D2 of the second defect type in such a way that the defects D2 of the second defect type reach the second electrode 104 in the time period or at the end of the time period 104 when the first voltage U1 is applied for the time period.

The time period may be determined as a function of the speed $v_2$ of movement of defects D2 of the second defect type in such a way that the defects D2 of the second defect type reach the second electrode 104 in the time period or at the end of the time period when the first voltage U1 is applied for the time period.

If the time period found in this way is too high for economic implementation, it may be provided to find conditions under which the time period is lower in comparison. For example, it may be provided to increase the temperature. For example, it may be provided to increase the first voltage U1.

It may be provided that a target defect structure is selected in which a distance of the initial positions of all defects D1 of the first defect type or a selected starting point for the defects D1 of the first defect type to the interface degrading during the intended operation is maximal. This can be done under the framework condition that a proportion of attached defects D1 of the first defect type on the opposite interface is less than a critical threshold. It may be provided that a loading time that can in particular be performed economically is specified as a time period for the application of the first voltage U1. It may be provided to look for a combination of temperature and first voltage U1 at which a number of defects D1 of the first defect type that attach to the opposite interface when the voltage U1 is applied at the temperature for the time duration is less than the critical threshold.

> 908: applying the first voltage U1 between the first electrode 102 and the second electrode 104 in the time period.

The method may also provide the following steps prior to step 902 or prior to step 904:

> 900-A: applying the first voltage U1 to the semiconductor component 100.
>
> 900-B: detecting a change in a current flowing through the first and second electrodes.
>
> 900-C measuring a time duration from application of the first voltage U1 until detection.
>
> 900-D determining the target position or the time period as a function of the time duration.

In step 900-D, it may be provided that a property of the dielectric layer 106 that indicates the initial position for defects D2 of the second defect type is determined. In this case, the target position or the time period is determined in such a way that most of the defects D2 of the second defect type are in a desired position in the dielectric layer 106 when the defects D1 of the first defect type reach the target position.

If the desired positions of the defects D1 of the first defect type and/or of the defects D2 of the second defect type cannot be adjusted with a single application of the first voltage U1, the method may provide that the first voltage U1 is applied at a first temperature for a first time duration, the second voltage U2 is applied at a second temperature for a second time duration, and the first voltage U1 is subsequently again applied at the first temperature. These steps may be performed iteratively. The voltages and/or the temperatures may change from iteration to iteration. For example, it is possible to apply the first voltage U1 at the temperature T=200° C. and to then apply the second voltage U2 at the temperature T=100° C. This may be repeated several times. This exploits a different voltage and temperature acceleration occurring for the different defects.

It may be provided to take several loading iterations into account. The loading iterations may be taken into account under varying temperatures and voltages. It may be provided to determine these voltages and temperatures in such a way that at any time, the framework condition is satisfied that no first dielectric breakdown occurs due to attachment to the interface degrading under these conditions. It is preferable to start with a loading step and an iteration at high temperatures of, for example, 175° C. and lower voltage, for example 5V.

Preferably, if the time duration required to reach the target position is over the loading time, the temperature is increased. Preferably, when a dielectric breakdown occurs, the first voltage U1 is reduced.

Instead of detecting the change in current, a change in a surface condition of the first electrode 102 and/or a condition of a boundary layer between the first electrode 102 and the dielectric layer 106 may be detected.

Instead of applying the first voltage U1 to the semiconductor component 100, it is also possible to perform steps 900-A to 900-D on another semiconductor component 100 having the same properties as said component.

A change in the distributions of defects is described below with reference to FIGS. 10, 11 and 12.

Figure 10:
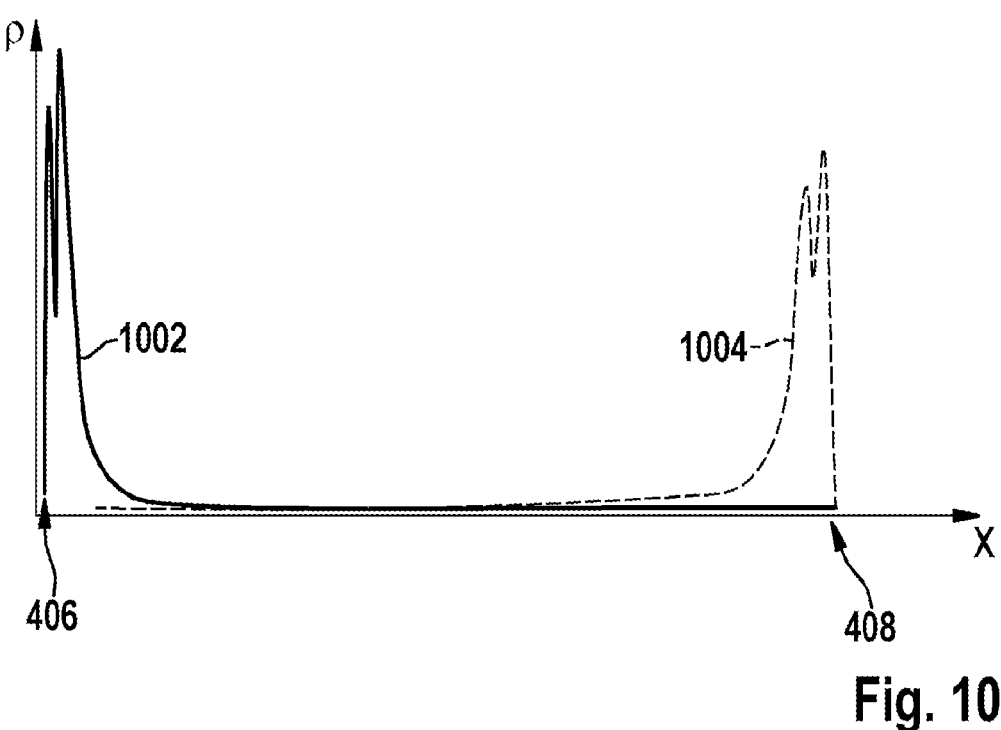
FIG. 10 shows distributions of defects.

FIG. 10 shows a distribution 1002 of the defects D1 of the first defect type with its center at the location 406 of the second electrode 104 and a distribution 1004 of the defects D2 of the second defect type with its center at the location 408 of the first electrode 102. The defects D2 of the second defect type form a defect buffer for the interface at the first electrode 102.

Figure 11:
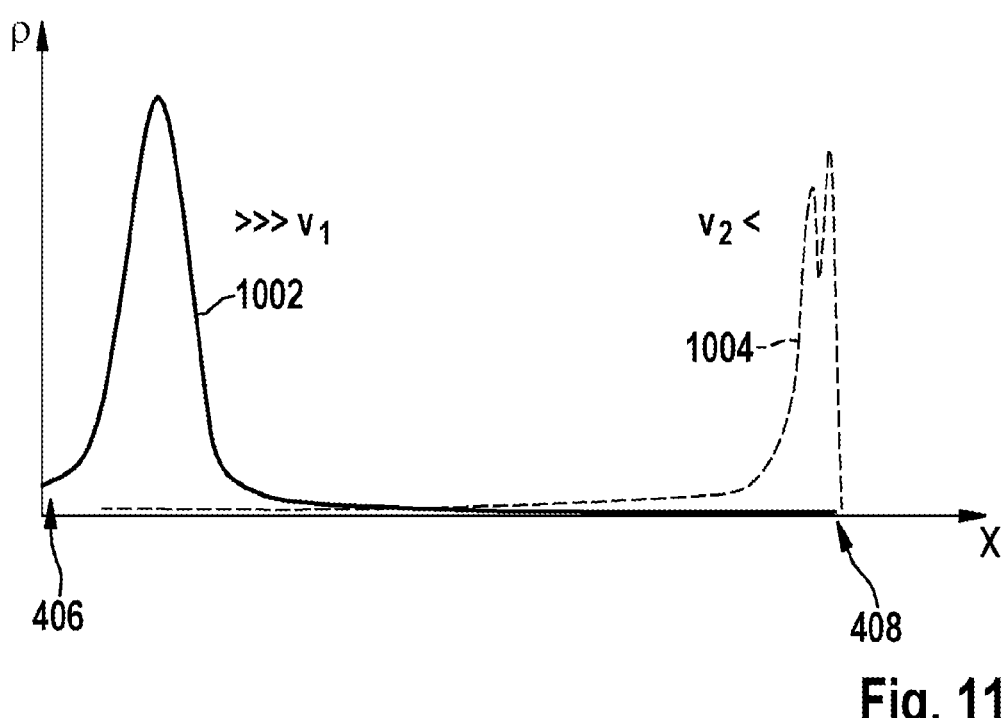
FIG. 11 shows a movement of the distributions.

FIG. 11 shows a movement of the distribution 1002 of the defects D1 of the first defect type away from the location 406 of the second electrode 104 and toward the location 408 of the first electrode 102.

FIG. 11 shows a movement of the distribution 1004 of the defects D2 of the second defect type away from the location 408 of the first electrode 102 in the direction of the location 406 of the second electrode 104.

The speed $v_1$ of movement of the defects D1 of the first defect type is greater than the speed $v_2$ of movement of the defects D2 of the second defect type when the second voltage U2 is applied at the temperature T. In the example, the defects D1 of the first defect type and the defects D2 of the second defect type are selected in such a way that the speed $v_1$ is sufficient for the defects D1 of the first defect type to overcome a distance between the first electrode 102 and the second electrode before the defects D2 of the second defect type can move out of the interface at the speed $v_2$.

Figure 12:
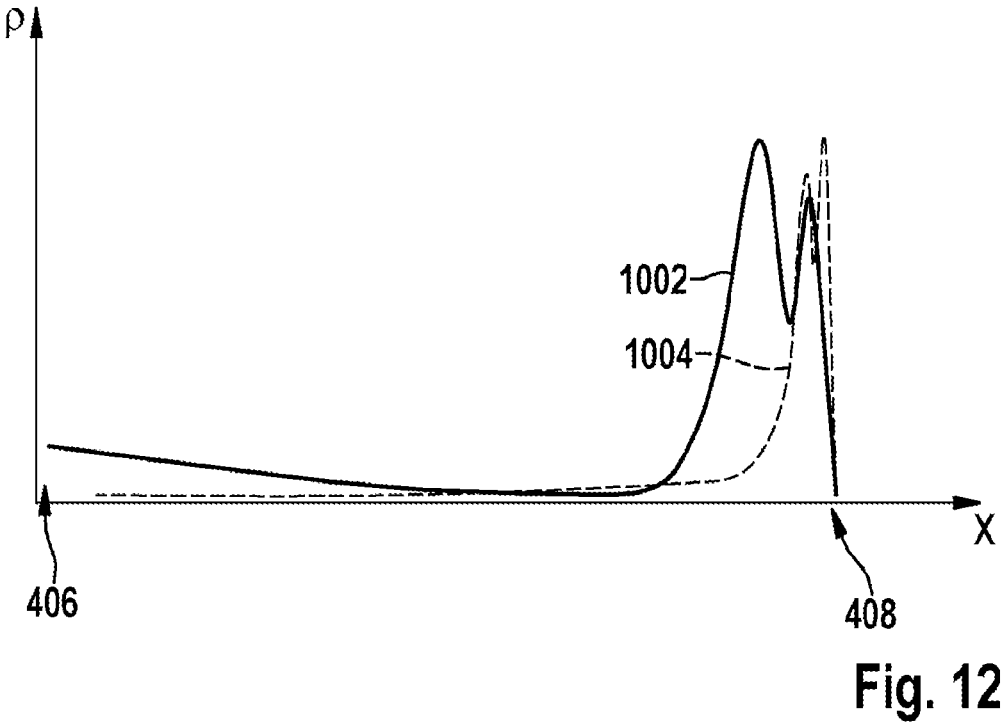
FIG. 12 shows distributions of defects at the end of the movement.

FIG. 12 shows a distribution 1002 of the defects D1 of the first defect type with its center at the location 408 of the first electrode 102 and a distribution 1004 of the defects D2 of the second defect type with its center at the location 408 of the first electrode 102. The defects D2 of the second defect type compensate for the defects D1 of the first defect type in the interface. This avoids or delays a breakdown and/or a lower leakage current occurs than without this arrangement of the defects D2 of the second defect type. This extends the lifetime.

The described methods can be supplemented by influencing a development of "desired" defects and their development position, i.e., their initial position, for example their distance $d_t$ from the desired interface.

This takes place, for example, by adding a defect-rich additional layer of a material related to the dielectric layer 106, near the electrode at which the desired interface is located.

Insertion of displaceable defects by doping, for example by diffusion or ion implantation, is also possible.

An adjustment of process conditions that favors the development of defects may also be provided. Starting from a layer with a minimal density of oxygen deficiencies, a layer that is rich in oxygen deficiencies and near the electrode at which the desired interface is to be located can, for example, develop via a reduction of an oxygen partial pressure, e.g., in the case sputter deposition, or a change in a sol composition, e.g., in the case of chemical solution deposition (CSD), and/or a temperature change at the end of a deposition, e.g., in the case of CSD, and/or an additional annealing. The defects of said layer could then be used selectively in large numbers as a buffer.

The defects D2 of the second defect type are selected in the example such that they can compensate for an effect of the defects D1 of the first defect type that reduces the effective Schottky barrier. The defects D2 of the second defect type are moved to a particular position in the dielectric layer 106 by the method and form a defect buffer there. The defect buffer in a thus produced dielectric layer 106 or the additional layer forms a defect buffer, e.g., of a density of $10^{\wedge}16/cm^2$-$10^{\wedge}18/cm^2$. A defect buffer of a lower or higher density of restoring defects can be realized.

In the semiconductor component 100 according to the second embodiment, defects D2 of the second defect type that can compensate for the defects D1 of the first defect type are taken into account. It may also be provided that defects D3 of a third defect type that, like the defects D1 of the first defect type, can cause a dielectric breakdown are taken into account. For example, the dielectric breakdown occurs if a number of charged defects D3 of the third defect type attaching to the affected interface exceeds a threshold value. If a dielectric breakdown occurs as a result, the relevant interface is likewise partially or completely destroyed. As a result, the service life of the semiconductor component 100 may be shortened, in particular if the defects D3 of the third defect type reach the interface before the defects D1 of the first defect type.

A determination of the initial position and a displacement of the initial position of the defects D3 of the third defect type takes place as described for the defects D1 of the first defect type. In the example, the time period for which the first voltage U1 is applied is determined as a function of the defects that first reach the interface to be protected during the intended operation. Optionally, the time period is the longest time period for which the defects D3 of the third defect type and the defects D1 of the first defect type can be moved with the first voltage U1 without the defects D1 of the first defect type and the defects D3 of the third defect type being able to attach to the interface.

The methods described may provide that the semiconductor component 100 is arranged in an actuator, in particular a MEMS, a micromirror, a print head or a speaker.

The invention claimed is:

1. A method for producing a semiconductor component, comprising the following steps:
arranging a dielectric layer between a first electrode and a second electrode of the semiconductor component, wherein defects of a first defect type are present in the dielectric layer;

determining a time period for movement of defects of the first defect type into a target position in the dielectric layer;

determining a first voltage for the movement of the defects of the first defect type in the dielectric layer; and determining a temperature for loading with the first voltage;

applying the first voltage between the first electrode and the second electrode at the temperature in the time period.

2. The method according to claim 1, wherein the first voltage or the time period is determined as a function of a property of the dielectric layer that characterizes an initial position for defects of the first defect type, and a property that characterizes a speed of movement of defects of the first defect type in the dielectric layer, wherein the first voltage or the time period is determined as a function of a distance between the initial position and the target position.

3. A method for producing a semiconductor component, comprising the following steps:

arranging a dielectric layer between a first electrode and a second electrode of the semiconductor component, wherein defects of a first defect type are present in the dielectric layer;

determining a time period for movement of defects of the first defect type into a target position in the dielectric layer;

determining a first voltage for the movement of the defects of the first defect type in the dielectric layer; and determining a temperature for loading with the first voltage;

applying the first voltage between the first electrode and the second electrode at the temperature in the time period, wherein the temperature that also determines a speed of movement of defects of the first defect type in the dielectric layer is determined, and: i) the first voltage is determined as a function of the speed in such a way that when the first voltage is applied for the time period, the defects of the first defect type reach the target position in the time period or at the end of the time period, and/or ii) the time period is determined as a function of the speed in such a way that when the first voltage is applied for the time period, the defects of the first defect type reach the target position in the time period or at the end of the time period.

4. The method according to claim 1, wherein the defects of the first defect type can be moved in a first direction toward the first electrode when the first voltage with a first polarity is applied between the first electrode and the second electrode, wherein the defects of the first defect type can be moved in a second direction toward the second electrode when a second voltage with a second polarity opposite to the first polarity is applied between the first electrode and the second electrode, wherein the method further comprises:

applying the second voltage;

detecting a change of a current flowing through the first and second electrodes, and/or a change in a surface condition of the first electrode and/or a condition of a boundary layer between the first electrode and the dielectric layer;

measuring a time duration from application of the second voltage until detection;

determining the target position or the time period as a function of the time duration.

5. The method according to claim 1, wherein the dielectric layer includes defects of a second defect type, which can be moved in the direction toward the second electrode when the first voltage is applied, wherein the method further comprises:

detecting a change in a current flowing through the first or the second electrode when the first voltage is applied, and/or a change in a surface condition of the second electrode and/or a condition of a boundary layer between the second electrode and the dielectric layer that occurs when the first voltage is applied;

measuring a time duration from application of the first voltage until detection;

determining the target position or the time period as a function of the time duration.

6. The method according to claim 5, wherein a property of the dielectric layer that characterizes an initial position for defects of the second defect type is determined, and wherein the first voltage or the time period is determined as a function of a distance of the initial position for defects of the second defect type to the second electrode.

7. The method according to claim 5, wherein a temperature that also determines a speed of movement of defects of the second defect type in the dielectric layer is determined, and: i) the first voltage is determined as a function of the speed of movement of defects of the second defect type in such a way that when the first voltage is applied at the temperature for the time period, the defects of the second defect type reach the second electrode in the time period or at the end of the time period, and/or ii) the time period is determined as a function of the speed of movement of defects of the second defect type in such a way that when the first voltage is applied at the temperature for the time period, the defects of the second defect type reach the second electrode in the time period or at the end of the time period.

8. The method according to claim 1, wherein defects of a further defect type are present in the dielectric layer, wherein the method further comprises:

determining a further voltage with a polarity opposite to the first voltage, for loading the dielectric layer;

determining a time period and a temperature for the loading;

applying the further voltage between the first electrode and the second electrode at the temperature in the time period.

9. The method according to claim 1, further comprising:

arranging the semiconductor component in a memory or an actuator or a MEMS or a micromirror or a print head or a speaker.

10. A device for producing a semiconductor component, the device comprising:

a regulating and/or control unit configured to:

determining a time period for movement of defects of the first defect type into a target position in a dielectric layer, the dielectric layer being arranged between a first electrode and second electrode of the semiconductor component, wherein defects of a first defect type are present in the dielectric layer;

determining a first voltage for the movement of the defects of the first defect type in the dielectric layer; and determining a temperature for loading with the first voltage;

applying the first voltage between the first electrode and the second electrode at the temperature in the time period.

11. The device according to claim 10, further comprising:

a contacting unit for a wafer, wherein the wafer includes a first electrode, a second electrode, and a dielectric layer arranged between the first electrode and the second electrode of the wafer, wherein the contacting unit is configured to apply a voltage between the first electrode and the second electrode of the wafer according to a specification of the regulating and/or control unit.

\* \* \* \* \*